(12) United States Patent
Hopper et al.

(10) Patent No.: US 8,815,700 B2
(45) Date of Patent: Aug. 26, 2014

(54) METHOD OF FORMING HIGH LATERAL VOLTAGE ISOLATION STRUCTURE INVOLVING TWO SEPARATE TRENCH FILLS

(75) Inventors: Peter J. Hopper, San Jose, CA (US); William French, San Jose, CA (US); Kyuwoon Hwang, Palo Alto, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/315,934

(22) Filed: Dec. 8, 2008

(65) Prior Publication Data

US 2010/0144116 A1 Jun. 10, 2010

(51) Int. Cl.
*H01L 21/76* (2006.01)

(52) U.S. Cl.
USPC ........... 438/422; 438/424; 438/427; 438/435; 438/437; 257/E21.246; 257/E21.546; 257/E21.548; 257/E21.563; 257/E21.628

(58) Field of Classification Search
USPC .................. 438/422, 424, 427; 257/E21.246
See application file for complete search history.

(56) References Cited

U.S. PATENT DOCUMENTS

| 4,211,582 | A | * | 7/1980 | Horng et al. | 438/426 |
| 6,069,091 | A | * | 5/2000 | Chang et al. | 438/719 |
| 6,207,534 | B1 | * | 3/2001 | Chan et al. | 438/427 |
| 6,303,413 | B1 | * | 10/2001 | Kalnitsky et al. | 438/151 |

* cited by examiner

*Primary Examiner* — Matthew Landau
*Assistant Examiner* — Sonya McCall Shepard
(74) *Attorney, Agent, or Firm* — Wade J. Brady, III; Frederick J. Telecky, Jr.

(57) ABSTRACT

In a SOI process, a high lateral voltage isolation structure is formed by providing at least two concentric dielectric filled trenches, removing the semiconductor material between the dielectric filled trenches and filling the resultant gap with dielectric material to define a single wide dielectric filled trench.

17 Claims, 8 Drawing Sheets

METHOD OF FORMING HIGH LATERAL VOLTAGE ISOLATION STRUCTURE INVOLVING TWO SEPARATE TRENCH FILLS

FIELD OF THE INVENTION

The present invention relates to voltage isolation of an active region on a semiconductor chip. In particular it relates to high lateral voltage isolation structures and methods of forming such structures.

BACKGROUND OF THE INVENTION

Very high voltage isolation on silicon or other semiconductor material chips requires a box of isolation material surrounding the active region on the semiconductor chip. Typically vertical isolation is achieved by making use of a Silicon on Insulator (SOI) process with a SOI underlying layer defining the lower boundary of the isolated active region, and an overlying layer of dielectric material forming the upper boundary of the active region. Lateral isolation is, in turn, achieved by etching a trench around the active region and filling the trench with dielectric material such as oxide, an oxide, nitride stack, an oxide, nitride, polysilicon stack, or other dielectric material. By virtue of its box-like configuration this type of isolation is commonly referred to as box isolation. It will be appreciated that the isolation thickness has to be increased as the voltage levels increase.

A problem encountered in the past when dealing with very high lateral voltage isolation is that as the film thickness of the dielectric increases, film stresses in the dielectric film become ever more apparent. At a trench width of about 6 um, the film thickness along each wall of the trench is about 3 um, and leads to excessive film stress, thus essentially limiting the maximum voltage that can be isolated in a lateral direction. In order to isolate to a level of 1000V for example, a 20 um wide trench filled with dielectric is required, which is not feasible using the above-described technique.

One prior art solution has been to form two or more concentric trenches that are each sufficiently narrow so as not to suffer from film stress problems. However, due to the resultant silicon bands or islands that are formed between the filled trenches a charging effect occurs of the intermediate silicon, which results in a voltage drift of the floating nodes defined by the trenches. This is best illustrated by the sectional view of FIG. 1, which shows an active area 100 located on top of a SOI layer 102. A first dielectric filled trench 104 is formed around the active region and a second dielectric filled trench 106 is formed concentrically around the first trench 104. FIG. 1 shows an additional dielectric filled trench 110. Over time the high lateral voltage (in this case 1000V) applied at location 120 charges the silicon between trenches 104 and 110, which can cause anomalous effects such as sidewall inversion, parasitic substrate currents and drift of adjacent devices The present invention seeks to provide a new approach for high lateral voltage isolation that does not suffer from the above mentioned limitations.

SUMMARY OF THE INVENTION

According to the invention, there is provided a method of isolating an active region in a semiconductor chip against high lateral voltages, comprising forming at least two initial trenches around the active region, depositing a dielectric in the trenches, removing any semiconductor material between the trenches to define at least one additional trench, and depositing a dielectric in said at least one additional trench. The initial trenches are typically formed in a manner know in the art, which involves depositing an oxide-nitride stack to act as a hard mask, depositing a photoresist over the hard mask, imaging the photoresist and then selectively etching away the hard mask. Thereafter the remaining photoresist is stripped away and the hard mask is used as a mask in etching the silicon to define the trenches. The etching of the silicon may be performed using a plasma etch that selectively etches silicon over oxide and nitride. The initial trenches are preferably etched down to a SOI layer and are typically 6 um wide as this results from 2×3 um depositions. 3 um is a maximum limit for a chemical vapor deposition (CVD) due to cost and intrinsic stress. The initial trenches may then be filled by first growing a trench side wall oxide and thereafter depositing the dielectric into the trench using chemical vapor deposition (CVD). Once the dielectric, which may be oxide or an oxide, nitride stack or an oxide, nitride, polysilicon stack or any other dielectric, is deposited in the initial trenches, the dielectric material extending above the trenches is typically flattened, e.g. by chemical mechanical polishing (CMP). Any remaining nitride hard mask material may then be removed using a nitride etch. Optionally another nitride hard mask layer may then be deposited. In accordance with the invention, the semiconductor material between the initial trenches is removed by a masking and etching technique, which may include depositing a photoresist, imaging the photoresist, and etching away at least the portion of the nitride-oxide hard mask that covers the semiconductor material that is to be removed, whereafter the photoresist is stripped away. The exposed semiconductor material may then be etched away using a silicon etch, preferably down to the SOI layer to define said at least one additional trench. The at least one additional trench may then be filled with dielectric as part of a second CVD trench fill, thereby filling the region between the initial trenches to define one combined, wide trench. The dielectric material extending above the one or more additional trenches is typically flattened e.g. by CMP. Thus according to the invention there is provided a semiconductor chip that includes a dielectric filled trench that is not limited in width by the thickness of the CVD deposited layers. The semiconductor chip may therefore include a dielectric filled trench that is, for example, more than 15 μm wide.

DETAILED DESCRIPTION OF THE INVENTION

The present invention proposes forming a dielectric filled isolation trench around an active region of a semiconductor capable of providing very high lateral voltage isolation while addressing the issues of film stress and charging of semiconductor material between multiple filled trenches. In particular, the present invention provides an effective technique of forming a dielectric filled trench that is more than 6 um wide.

Figure 1:
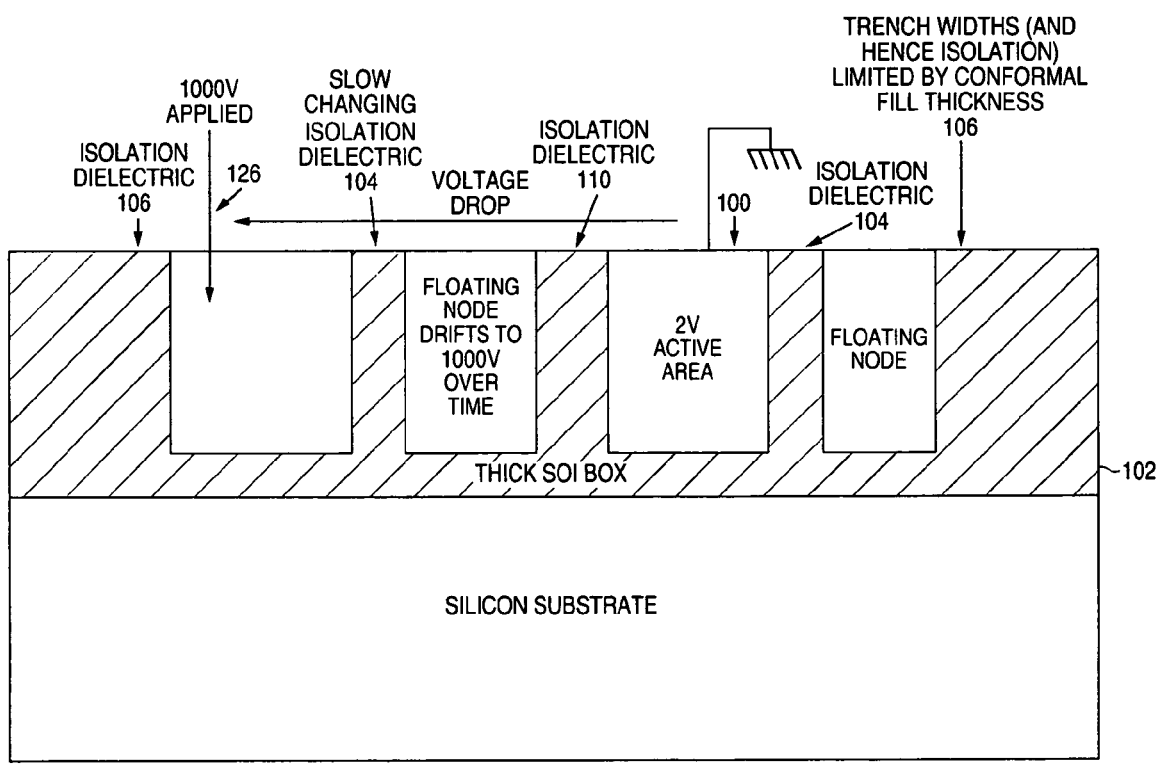
FIG. 1 is a sectional view through a prior art box isolated active region.
Figure 2:
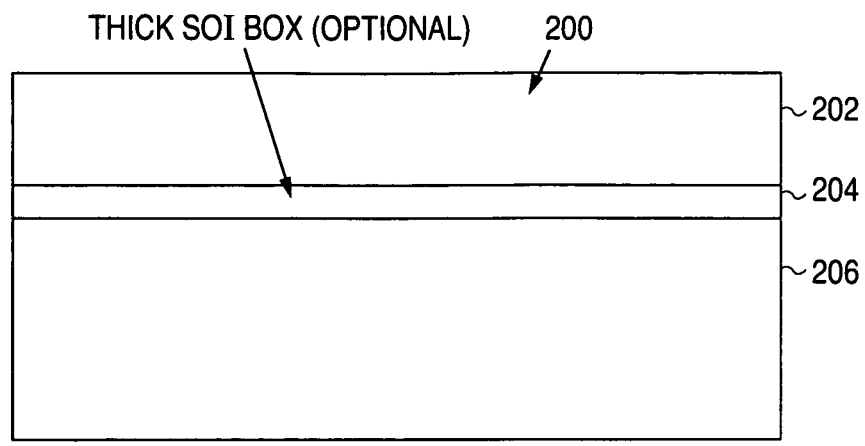
FIGS. 2-20, show sectional views through a semiconductor illustrating the steps involved in providing lateral isolation around an active region in accordance with one embodiment of the invention.
Figure 3:
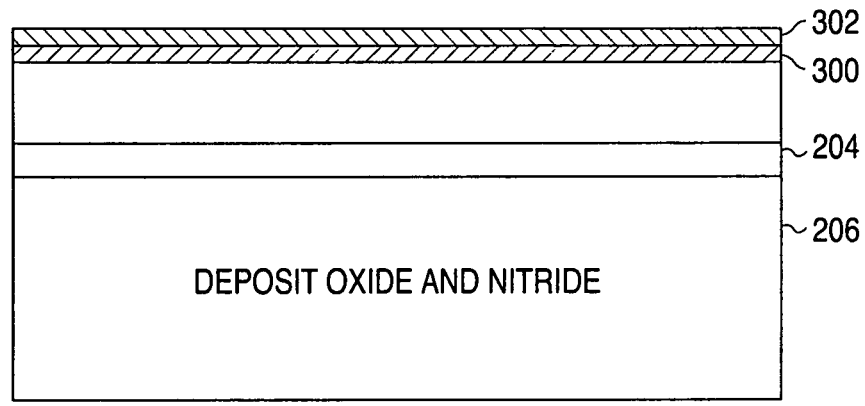
Figure 4:
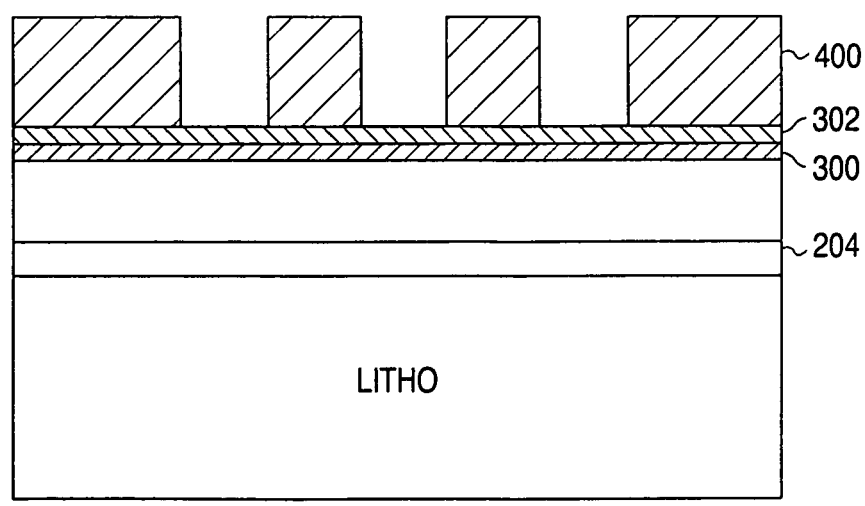
Figure 5:
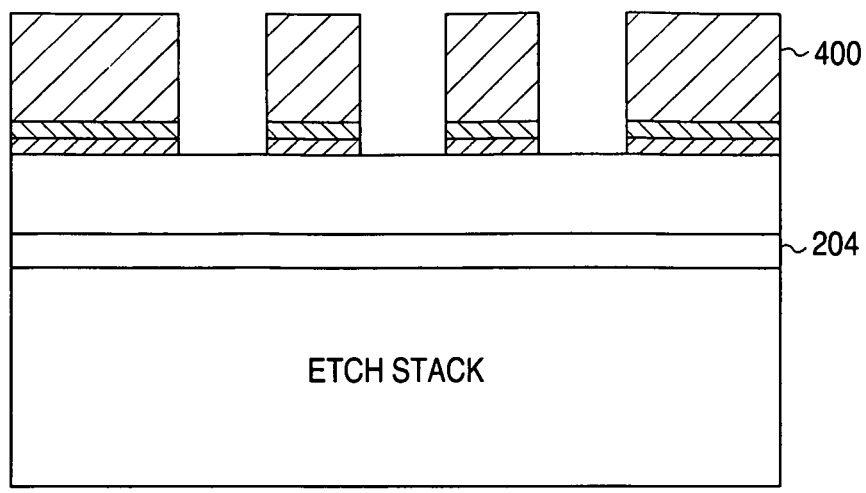
Figure 6:
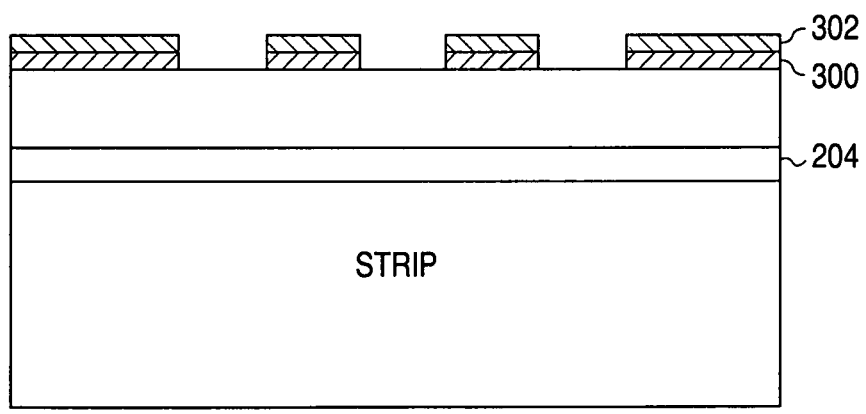
Figure 7:
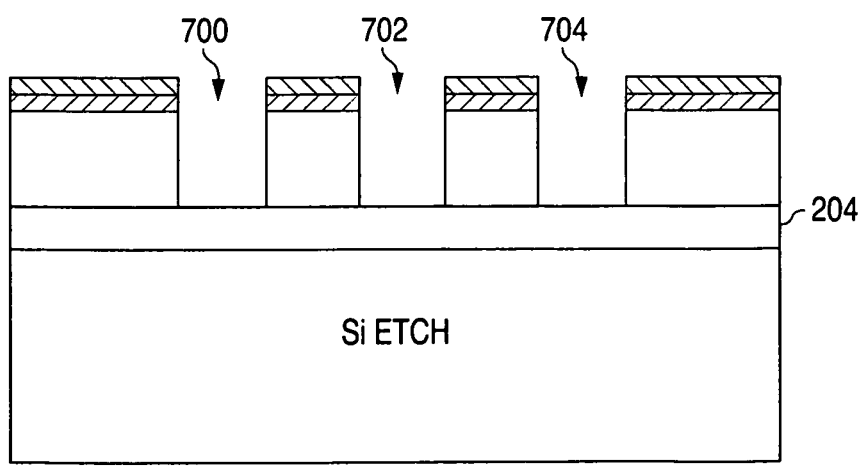
Figure 8:
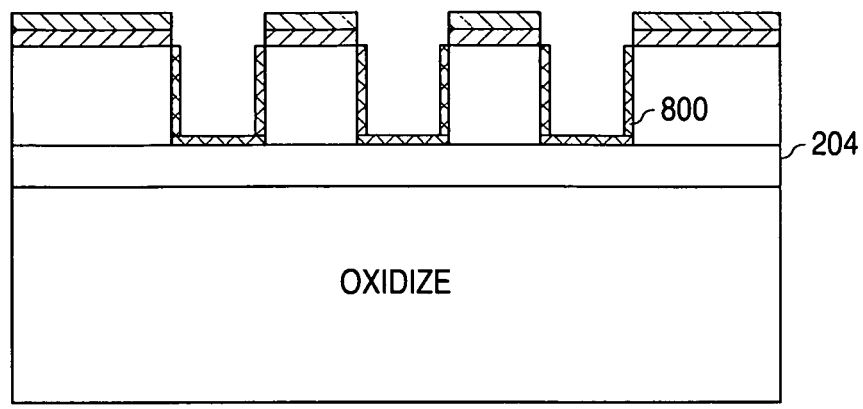
Figure 9:
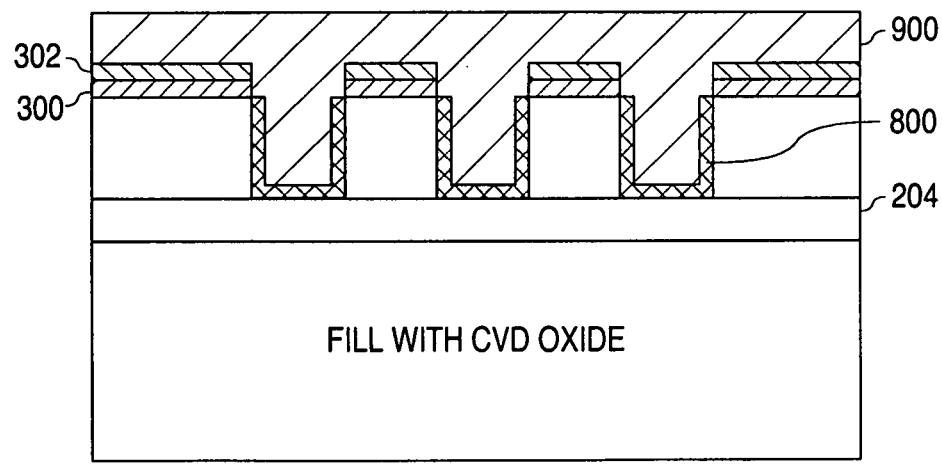

FIGS. 2 to 8 show the steps involved in forming such a wide trench according to one embodiment of the invention. In FIG. 2 an active region 200 is defined in a semiconductor material 202 as part of a Silicon on Insulator (SOI) process which includes an insulating layer (also referred to herein as a SOI layer) 204 formed on a semiconductor substrate 206. The SOI layer 204 will form the lower isolation region of a box isolation. While the present embodiment includes a SOI layer, the present embodiment is not so limited. In order to form the lateral isolation of the box three trenches are etched to extend substantially concentrically down to the SOI layer 206 as is described with reference to FIGS. 3 to 7. Initially a layer of oxide 300 (oxide hard mask) and a layer of nitride 302 (nitride hard mask) is deposited on the semiconductor material 202 to form an oxide-nitride stack, as shown in FIG. 3. In FIG. 4 photoresist 400 is deposited on the oxide-nitride stack. The photoresist 400 is imaged and selectively removed as part of a photolithographic process, as shown in FIG. 4. The oxide-nitride stack is then etched, as shown in FIG. 5, whereafter the photoresist is stripped away as shown in FIG. 6. The remaining oxide-nitride stack thus forms a hard mask, which is used in etching away the silicon to define trenches. In this embodiment three trenches 700, 702, 704 are etched using a plasma etch that etches silicon selectively over oxide and nitride. As shown in FIG. 7 the trenches 700, 702, 704 extend down to the SOI layer 204. It will be appreciated that in embodiments where a SOI layer is not formed, the depth of the trenches will be dictated by the duration of the etch. Preferably the widths of the trenches is kept to less than 6 um and their separation is limited to less than 6 um to ensure not only the integrity of the dielectric in these initial trenches but also the integrity of the dielectric subsequently deposited between the trenches, The trenches 700, 702, 704 are filled by first growing a trench side wall oxide 800 e.g. thermal oxide (FIG. 8) and thereafter filling the trenches with dielectric e.g. oxide 900 using chemical vapor deposition (CVD) as shown in FIG. 9. The dielectric fill 900, which in this embodiment comprises an oxide fill extends above the top of the trenches 700, 702, 704 as shown in FIG. 9.

Figure 10:
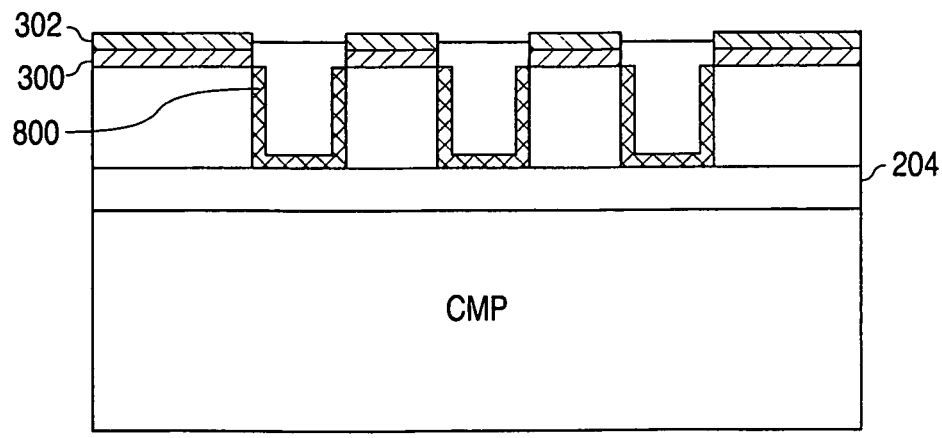
Figure 11:
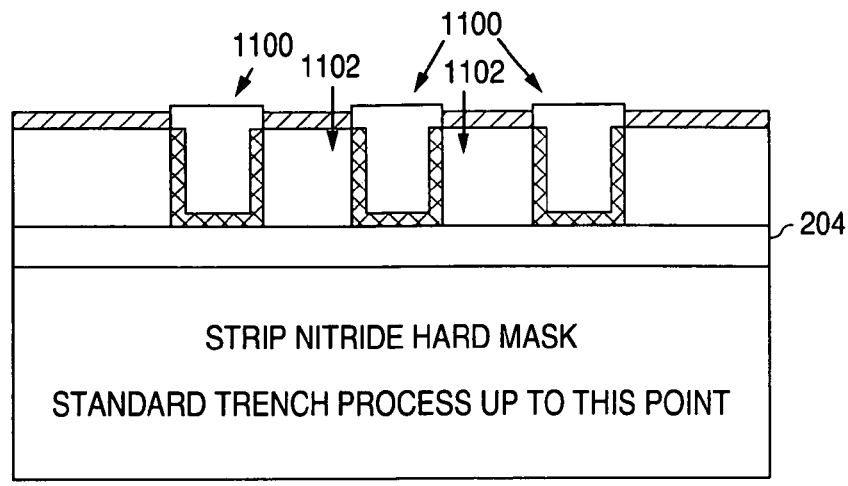

The dielectric extending above the top of the trenches is then flattened using chemical mechanical polishing (CMP), wherein the chemical aspect of the CMP causes the oxide fill to be removed to below the surface of the adjacent nitride hard mask 302, as shown in FIG. 10. Thereafter the nitride hard mask 302 of the oxide-nitride layer is stripped away as shown in FIG. 11. It will be appreciated that at this stage three concentric oxide filled trenches are defined, separated by semiconductor material, which in this embodiment is silicon, and is indicated by reference numeral 1102.

Figure 12:
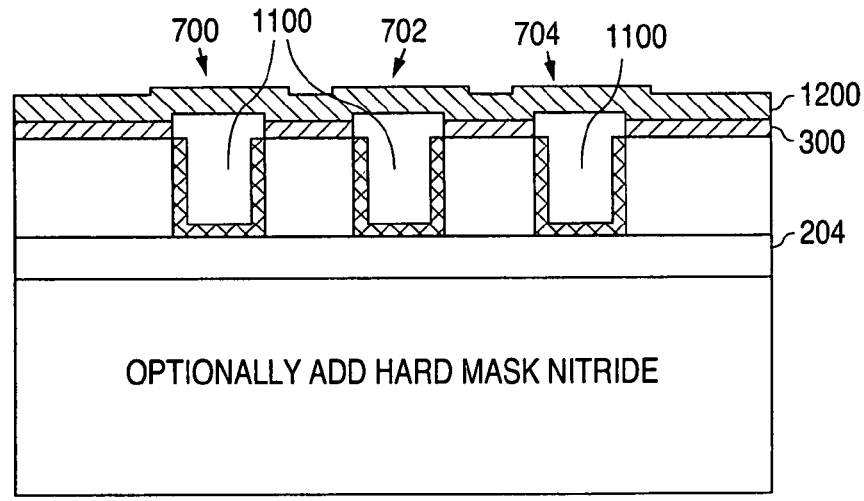
Figure 13:
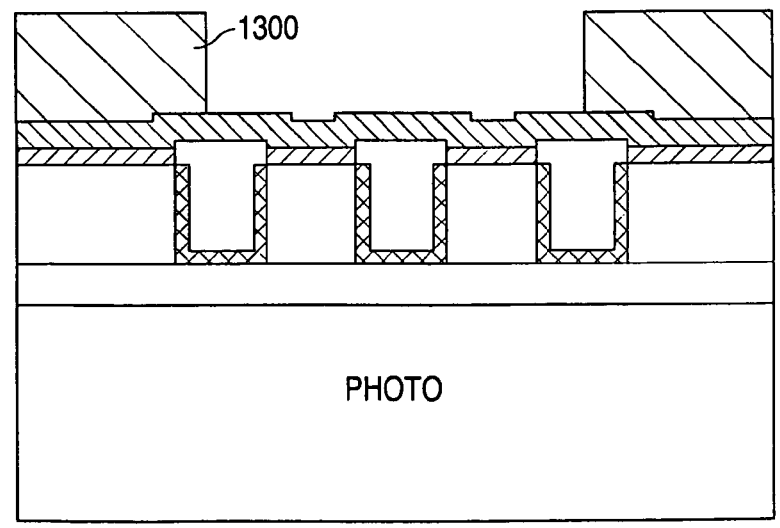
Figure 14:
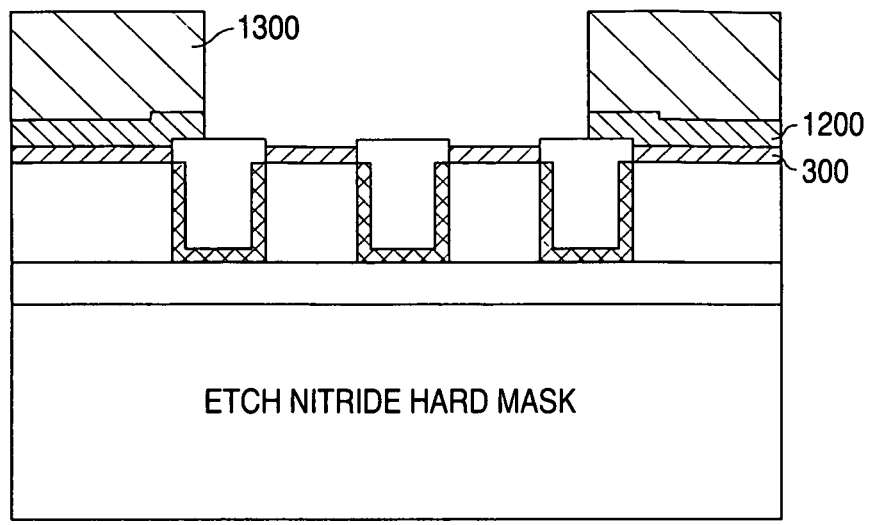
Figure 15:
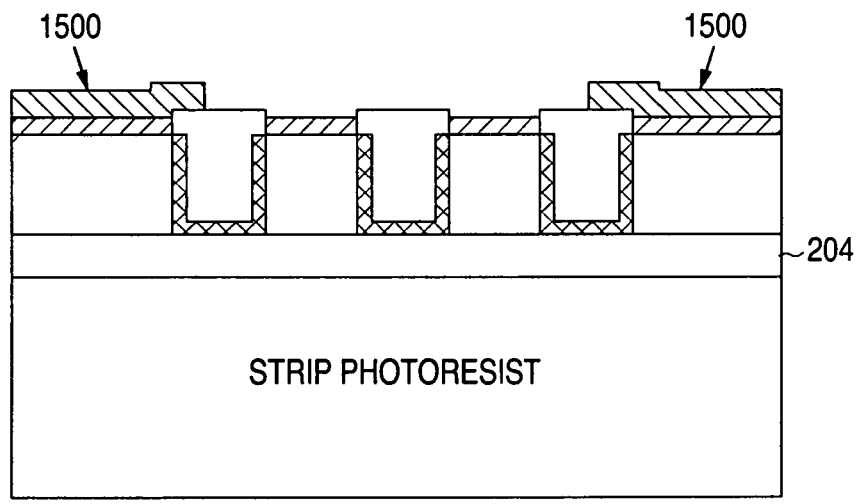
Figure 16:
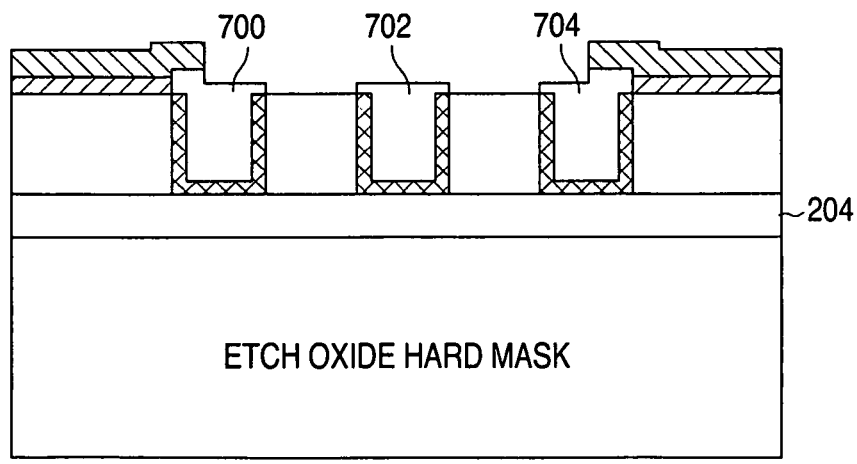
Figure 17:
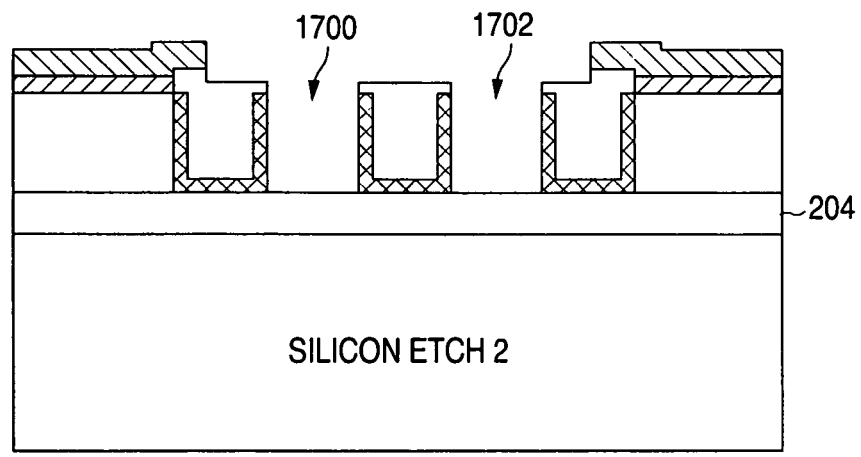

In accordance with the invention the semiconductor material 1102 is then etched away. Preferably all of the semiconductor material between the dielectric material in the trenches 700, 702, 704 is removed to leave two newly formed or additional trench as discussed below. Optionally a hard mask nitride layer is first deposited over the original oxide hard mask 300 and oxide material 1100 in the trenches 700, 702, 704 as shown in FIG. 12. A photolithographic process is then performed involving the deposition of a photoresist 1300, which is exposed and partially removed to define a mask for etching the oxide-nitride stack (defined by layers 300 and 1200) (FIG. 13). In FIG. 14 the nitride hard mask of the oxide-nitride stack is then etched away in the exposed region, and in FIG. 15 the photoresist is stripped away leaving the lateral portions of the hard mask defined by the oxide-nitride stack 1500. In FIG. 16 the oxide hard mask is stripped away. Thereafter, as shown in FIG. 17 a second silicon etch is performed that involves a plasma etch that etches the silicon between the oxide filled trenches 700, 702, 704, selectively over oxide and nitride to define two new trenches 1700, 1702 between the original oxide filled trenches 700, 702, 704. In the present embodiment, which involves a SOI layer 204 the new trenches 1700, 1702 are etched down to the SOI layer. In other embodiments, not involving a SOI layer, the etching is timed to provide an etch depth corresponding substantially to the depth of the original trenches 700, 702, 704.

Figure 18:
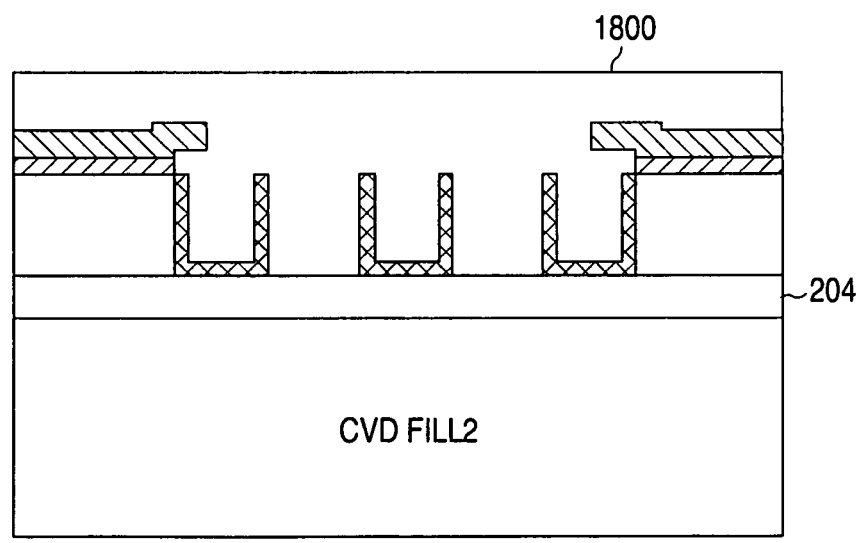

A second trench fill, shown in FIG. 18, is then performed using CVD to deposit dielectric material 1800 into the two new trenches 1700, 1702 to define a wide oxide-filled trench.

Figure 19:
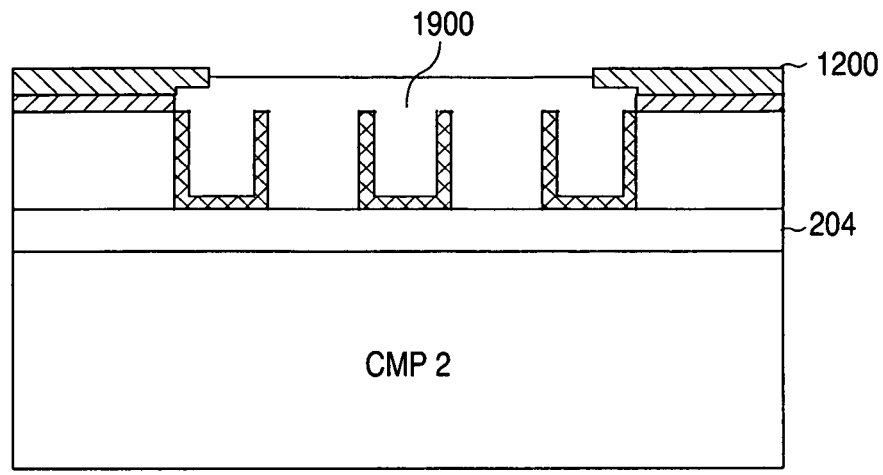
Figure 20:
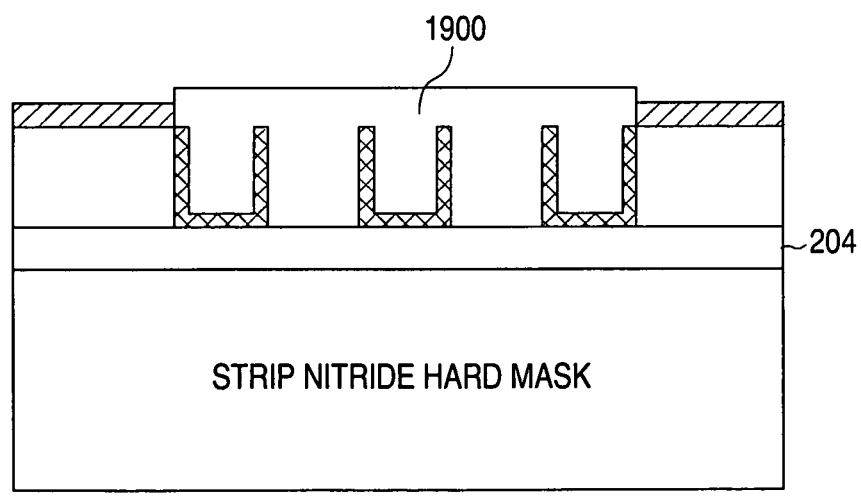

The excess dielectric material 1800 extending above the surface of the oxide-nitride stack is then flattened by CMP as shown in FIG. 19, leaving one wide trench dielectric-filled trench 1900. The nitride hard mask 1200 is then stripped away to leave the wide trench 1900 that extends down to the SOI layer 204, as shown in FIG. 20. Since it is desirable to keep the initial and subsequent trenches below 6 um in width but also remain wide enough to facilitate filling the trenches, it will be appreciated that for an embodiment of 2 initial trenches and one subsequent intermediate trench, each 5 um wide the combined trench would be 15 um wide. By simply adding further initial trenches the width can be increased as desired.

While this embodiment involved three initial trenches of less than 6 um width, it will be appreciated that only two or more than three initial trenches could be formed and subsequently joined in a manner similar to that described above, to define a single wide dielectric filled trench.

What is claimed is:

1. A method of isolating an active region in an SOI semiconductor chip that includes an insulating layer below the active region, against high lateral voltages, comprising
forming at least two initial trenches around the active region, the trenches extending substantially down to the insulating layer,
depositing a dielectric in the trenches to define dielectric-filled trenches extending substantially down to the insulating layer, thereafter
removing any semiconductor material between the dielectric-filled trenches to define at least one additional trench extending substantially down to the insulating layer, and
depositing a dielectric in said at least one additional trench.

2. A method of claim 1, wherein the initial trenches are formed by etching the silicon material using a plasma etch that selectively etches silicon over oxide or nitride.

3. A method of claim 1, wherein the initial trenches are less than 6 um wide and less than 6 um apart.

4. A method of claim 1, wherein the dielectric in the initial trenches is an oxide or an oxide, nitride stack or an oxide, nitride, polysilicon stack.

5. A method of claim 1, wherein the dielectric is deposited in the initial trenches and any dielectric material extending above the initial trenches is removed.

6. A method of claim 1, wherein the semiconductor material between the dielectric in the initial trenches is removed by a masking and etching technique.

7. A method of claim 1, wherein the semiconductor material between the dielectric in the initial trenches is removed by a masking and etching technique.

8. A method of claim 2, wherein prior to etching the silicon material an oxide-nitride stack is deposited and selectively etched using photolithography to define a hard mask.

9. A method of claim 5, wherein any dielectric material extending above the initial trenches is removed by chemical mechanical polishing (CMP).

10. A method of claim 6, wherein the masking and etching technique includes making use of an oxide-nitride stack and selectively etching away the stack using photolithography to define a hard mask.

11. A method of claim 7, wherein the masking and etching technique includes making use of an oxide-nitride stack and selectively etching away the stack using photolithography to define a hard mask.

12. A method of claim 7, wherein the exposed semiconductor material not covered by the hard mask is etched down to substantially the depth of the initial trenches.

13. A method of claim 10, wherein the exposed semiconductor material not covered by the hard mask is etched down to the SOI layer to define said at least one additional trench.

14. A method of claim 12, wherein the hard mask is then removed, whereafter a dielectric is deposited into said at least one additional trench.

15. A method of claim 13, wherein the hard mask is then removed, whereafter a dielectric is deposited into said at least one additional trench.

16. A method of claim 14, wherein any dielectric material extending above the one or more additional trenches is removed by CMP.

17. A method of claim 15, wherein any dielectric material extending above the one or more additional trenches is removed by CMP.

\* \* \* \* \*